(12) United States Patent
Joyner et al.

(10) Patent No.: US 8,238,759 B2
(45) Date of Patent: Aug. 7, 2012

(54) HIGH CAPACITY TRANSMITTER IMPLEMENTED ON A PHOTONIC INTEGRATED CIRCUIT

(75) Inventors: Charles H. Joyner, Sunnyvale, CA (US); Radhakrishnan L. Nagarajan, Cupertino, CA (US); Masaki Kato, Palo Alto, CA (US); Peter W. Evans, Mountain House, CA (US); Fred A. Kish, Jr., Palo Alto, CA (US)

(73) Assignee: Infinera Corporation, Sunnyvale, CA (US)

( * ) Notice: Subject to any disclaimer, the term of this patent is extended or adjusted under 35 U.S.C. 154(b) by 638 days.

(21) Appl. No.: 12/345,315

(22) Filed: Dec. 29, 2008

(65) Prior Publication Data

US 2009/0245795 A1    Oct. 1, 2009

Related U.S. Application Data

(60) Provisional application No. 61/028,719, filed on Feb. 14, 2008, provisional application No. 61/030,806, filed on Feb. 22, 2008.

(51) Int. Cl.
*H04B 10/04* (2006.01)
(52) U.S. Cl. ............... 398/183; 398/184; 398/188
(58) Field of Classification Search ........... 398/183–188
See application file for complete search history.

(56) References Cited

U.S. PATENT DOCUMENTS

| | | | | |
|---|---|---|---|---|
| 5,416,628 | A * | 5/1995 | Betti et al. ............ | 398/185 |
| 7,010,230 | B2 * | 3/2006 | Lee et al. ............ | 398/102 |
| 7,949,261 | B2 * | 5/2011 | Mikkelsen et al. ........ | 398/208 |
| 2002/0145787 | A1 | 10/2002 | Shpantzer et al. | |
| 2002/0181870 | A1 * | 12/2002 | Inoue et al. ........ | 385/37 |
| 2003/0095737 | A1 * | 5/2003 | Welch et al. ........ | 385/14 |
| 2005/0117915 | A1 * | 6/2005 | Miyazaki ............ | 398/188 |
| 2007/0009264 | A1 * | 1/2007 | Kamio et al. .......... | 398/102 |
| 2009/0185810 | A1 * | 7/2009 | Kaplan et al. .......... | 398/184 |

FOREIGN PATENT DOCUMENTS

| | | |
|---|---|---|
| EP | 1742389 A1 | 1/2008 |
| WO | 2007103410 A2 | 9/2007 |

OTHER PUBLICATIONS

Riblet, P., 'International Search Report,' Feb. 2009, European Patent Office, Rijswijk.
Riblet, P., 'Written Opinion of the International Searching Authority (PCT Rule 43bis.1),' Feb. 2009, European Patent Office, Munich.

(Continued)

*Primary Examiner* — Dzung Tran
(74) *Attorney, Agent, or Firm* — David L. Soltz

(57) ABSTRACT

A high capacity optical transmitter implemented on a photonic integrated circuit chip comprises a single light source which supplies a continuous wave having a particular wavelength to a plurality of modulators to form modulated optical information signals. A phase shifter is coupled to at least one of the modulators and is used to shift the phase of the corresponding modulated optical information signal associated with a particular modulator. A polarization beam combiner receives each of the modulated optical information signals from the modulators and the modulated optical information signal from the phase shifter and combines each of these signals to form a polarization multiplexed differential quadrature phase-shift keying signal. The light source, the plurality of modulators, the phase shifter and the polarization beam combiner are all integrated on the chip.

26 Claims, 12 Drawing Sheets

OTHER PUBLICATIONS

Griffin, R, et al., 'Integrated DQPSK Transmitter for Dispersion-Tolerant and Dispersion-Managed DWDM Transmission,' Optical Fiber Communication Conference (OFC) Post-conference Digest, Mar. 2003, pp. 770-771, vol. 86, OSA, Washington, DC, USA.

Serbay, M. et al., 'Comparison of Six Different RZ-DQPSK Transmitter Set-ups Regarding their Tolerance Towards Fibre Impairments in 8x40gb/s WDM-systems,' Advanced Modulation Formats, IEEE/LEOS Workshop, Jul. 2004, pp. 9-10, IEEE, Piscataway, New Jersey, USA.

Cole, C., et al., '100GbE-Optical Lan Technologies,' IEEE Communications Magazine, Dec. 2007, pp. 12-19, vol. 45, No. 12, IEEE Service Center, Piscataway, New Jersey, USA.

Doerr, C.R., et al., 'Monolithic DQPSK Receiver in InP With Low Polarization Sensitivity,' IEEE Photonics Technology Letters, Nov. 2007, pp. 1765-1767, vol. 19, No. 21, IEEE Service Center, Piscataway, New Jersey, USA.

* cited by examiner

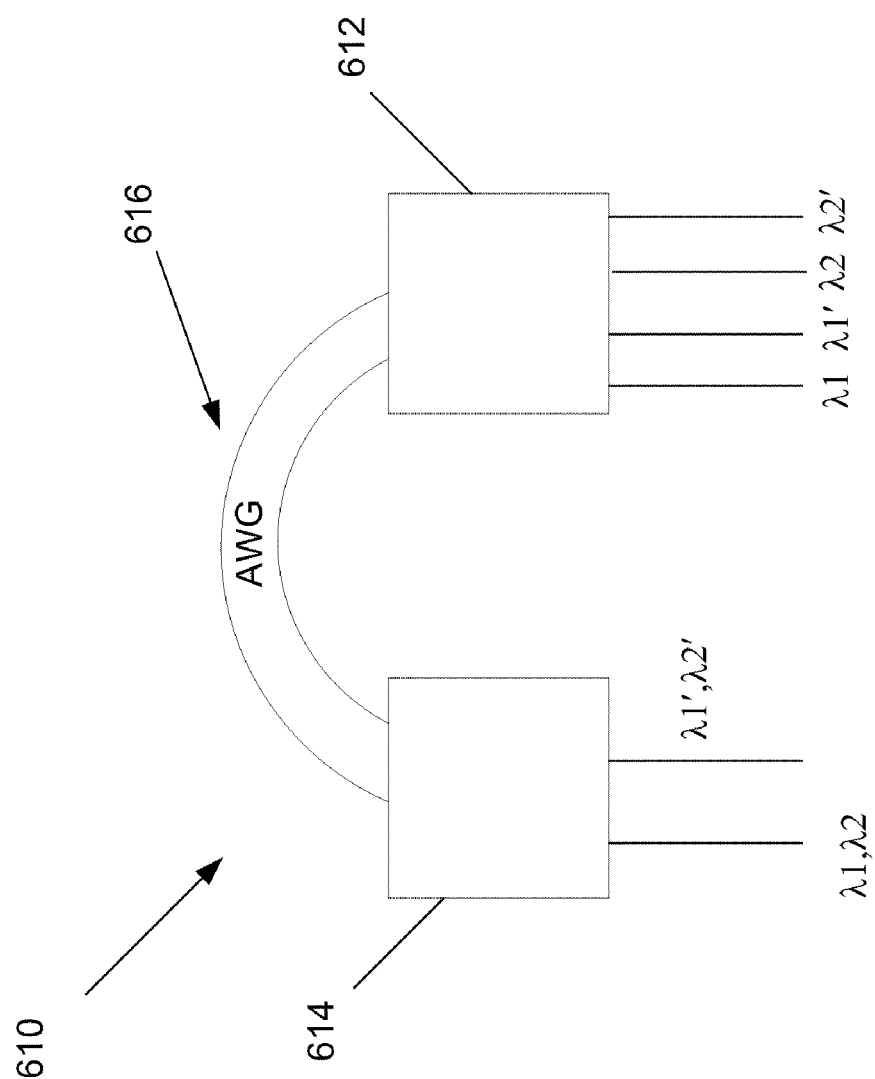

HIGH CAPACITY TRANSMITTER IMPLEMENTED ON A PHOTONIC INTEGRATED CIRCUIT

CROSS-REFERENCE TO RELATED APPLICATIONS

This application claims priority to U.S. Provisional Application No. 61/028,719 filed Feb. 14, 2008 and U.S. Provisional Application No. 61/030,806 filed Feb. 22, 2008 both of which are herein incorporated by reference in their entirety.

BACKGROUND OF THE INVENTION

1. Field of the Invention

Embodiments of the invention relate to the field of optical communication devices. More particularly, the present invention relates to a transmitter used for optical communication systems implemented on a photonic integrated circuit.

2. Discussion of Related Art

Wavelength division multiplexed (WDM) optical communication systems are known in which multiple optical signals, each having a different wavelength, are combined onto a single optical fiber. Such systems typically include a laser associated with each wavelength, a modulator configured to modulate the output of the laser, and an optical combiner to combine each of the modulated outputs. Conventionally, WDM systems have been constructed from discrete components. For example, the lasers, modulators and combiners have been packaged separately and mounted on a printed circuit board, More recently, however, many WDM components including transmitter, receivers and passive devices have been integrated onto a single chip also referred to as a photonic integrated circuit (PIC).

In order to further increase data transmission rates associated with WDM systems, various modulation formats have been proposed for generating the modulated output. In the common RZ modulation format, one of the two logical states corresponds to the presence of an optical pulse with proper optical power and duration shorter than the bit period to represent, for example, a logical 1 bit. The second of the two logical states corresponds to the absence of pulses, or to a pulse with reduced power to represent, for example a logical 0 bit. Another modulation format is the binary NRZ format which consists of transmitting a first logical state (for example the 1 bit) by a substantially constant optical signal associated with the entire time bit slot. The second logical state (for example the 0 bit) is transmitted with a reduced or absent optical power associated with the particular bit slot. Another modulation format, known as polarization multiplexed differential quadrature phase-shift keying ("Pol Mux DQPSK"), can provide higher data rates as compared to these other transmission formats. However, a transmitter outputting Pol Mux DQPSK signals typically requires more components and greater complexity than an RZ or NRZ transmitter. Thus, there is a need to integrate components associated with a Pol Mux DQPSK transmitter on a PIC in order to realize a WDM system transmitter having fewer discrete components with reduced costs.

SUMMARY OF THE INVENTION

Exemplary embodiments of the present invention are directed to a high capacity transmitter implemented on a photonic integrated circuit. In an exemplary embodiment, a transmitter photonic integrated circuit chip includes a continuous wave (CW) light source supplying light at a particular wavelength. A plurality of modulators are each coupled to the CW light source and each are configured to modulate the CW light source with data to form a modulated optical information signal, At least one phase shifter is coupled to at least one of the plurality of modulators. The phase shifter is configured to shift the phase of a corresponding modulated optical information signal associated with the one of the plurality of modulators. A polarization beam combiner receives each of the plurality of modulated optical information signals from the plurality of modulators and the modulated optical information signal from the at least one phase shifter. The polarization beam combiner is configured to combine each of the modulated optical information signals to form a polarization multiplexed differential quadrature phase-shift keying signal. The CW light source, the plurality of modulators, the at least one phase shifter and the polarization beam combiner are all integrated on the chip.

BRIEF DESCRIPTION OF THE DRAWINGS

FIG. 6A is a block diagram illustrating the AWG shown in FIG. 6.

DESCRIPTION OF EMBODIMENTS

Figure 1:
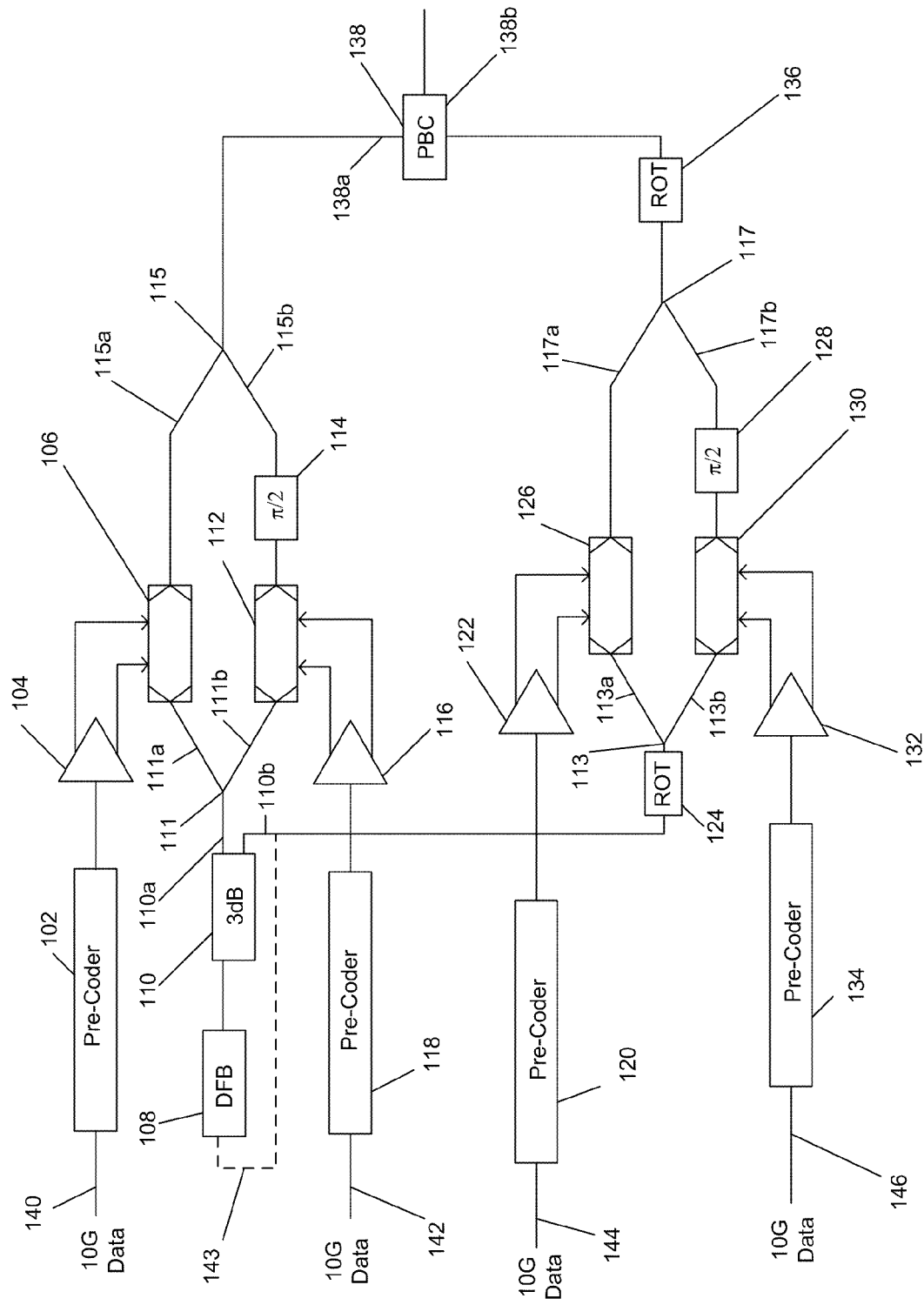
FIG. 1 is a block diagram of an exemplary transmitter in accordance with an embodiment of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. It will be understood that when an element or component is referred to herein as being "connected" or "coupled" to another element, it can be directly connected or coupled to the other element or intervening elements may be present therebetween. In contrast, when an element is referred to as being "directly connected" or "directly coupled" to another element, there are no intervening elements present. In the drawings, like numbers refer to like elements throughout.

FIG. 1 is a block diagram of an exemplary transmitter portion 100, a plurality of which define an optical transmitter photonic integrated circuit (TxPIC) in accordance with the present invention. Transmitter portion 100 is a polarization multiplexed differential quadrature phase-shift keying ("Pol Mux DQPSK") device configured for high data rate optical transmission. Generally, differential phase-shift keying (DPSK) is a modulation technique that assigns phase shifts to binary numbers for particular time slots. In other words, for a given time slot, if a phase shift occurred from the previous optical pulse then a binary "one" is assigned. If no phase shift occurred from the previous optical pulse then a binary "zero" is assigned. DPSK modulation carries one bit per optical pulse. However, DQPSK allows 2 bits per optical pulse by dividing each pulse into modulated in-phase (I) and quadrature (Q) components. The respective predecessor and successor I and Q components in a transmission pulse interfere with each other and the respective phase shifts in each component defines the digital data transmitted via the optical pulse. Accordingly, DQPSK modulation provides higher numbers of bits per optical pulse as compared to other modulation formats thereby increasing data rate transmission capacity.

Transmitter portion 100 utilizes a single laser 108, for example a distributed feedback laser (DFB) as the light source for at least four (4) modulators 106, 112, 126 and 130. In particular, DFB 108 outputs continuous wave (CW) light having a wavelength, for example, λ1 to a dual output coupler 110 (e.g. a 3 db coupler). The waveguides used to connect the various components of transmitter 100 on the PIC are polarization dependent. A first output 110*a* of coupler 110 supplies the CW signal to first branching unit 111 and the second output 110*b* supplies the CW signal to second branching unit 113. A first output 111*a* of branching unit 111 is coupled to modulator 106 and a second output 111*b* is coupled to modulator 112. Similarly, first output 113*a* is coupled to modulator 126 and second output 113*b* is coupled to modulator 130. Modulators 106, 112, 126 and 130 may be, for example, Mach Zender (MZ) modulators. Each of the MZ modulators receives CW light from DFB 108 and splits the light between two (2) arms or paths. An applied electric field in one or both paths of a MZ modulator creates a change in the refractive index. If the relative phase between the signals traveling through each path is 180° out of phase, destructive interference results and the signal is blocked. If the signals traveling through each path are in phase, the light passes through the device and modulated with an associated data stream.

Each of the MZ modulators 106, 112, 126 and 130 are driven with data signals supplied via driver circuits 104, 116, 122 and 132 respectively. In particular, a first data stream 140 at a data rate of, for example, 10 Gbit/second, is supplied to pre-coder circuit 102. Pre-coder circuit 102 encodes the data stream in accordance with a forward error correction (FEC) code to correct for transmission errors. FEC is a transmission technique whereby one or more codes are incorporated into the data stream for the detection and correction of data errors caused by signal noise and pulse distortion. The encoded data is supplied to driver circuit 104 which drives MZ modulator 106. The CW light supplied to MZ modulator 106 via DFB 108 and branching unit 111 is modulated with the encoded data from driver circuit 104. The modulated data signal from MZ modulator 106 is supplied to first input 115*a* of branching unit 115. Similarly, a second data stream 142 which may also be at a data rate of, for example, 10 Gbit/second, is supplied to pre-coder circuit 118 which encodes the data with an FEC code. The encoded data is supplied to driver circuit 116 which is used to drive MZ modulator 112. The CW light supplied to MZ modulator 112 via DFB 108 and branching unit 111 is modulated with the encoded data from driver circuit 116. The modulated data signal from MZ modulator 112 is supplied to phase shifter 114 which shifts the phase of the signal 90° (π/2) and supplies it to second input 115*b* of branching unit 115. The modulated data signals from MZ modulators 106 and 112 are supplied to polarization beam combiner (PBC) 138 via branching unit 115. PBC 138 will be described in more detail with reference to FIG. 1A.

A third data stream 144 is supplied to pre-coder circuit 120 which encodes the data with an FEC code. The encoded data is supplied to driver circuit 122 which is used to drive MZ modulator 126. A polarization rotator 124 may optionally be disposed between coupler 110 and branching unit 113. Polarization rotator 124 is a two port device that rotates the polarization of light propagating through the device by a particular angle, usually an odd multiple of 90°. Polarization rotator 124 is used to maximize signal content per spectral band of the fiber. Two completely different data streams may travel on the same wavelength through the fiber as long as their polarizations are orthogonal. The CW light supplied from DFB 108 is rotated by polarization rotator 124 and is supplied to MZ modulator 126 via first output 113*a* of branching unit 113. MZ modulator 126 then modulates the encoded data received from driver 122 onto the polarization rotated CW supplied by DFB 108. The modulated data signal from MZ modulator 126 is supplied to first input 117*a* of branching unit 117. A fourth data stream 146 which may also be at a data rate of, for example, 10 Gbit/second, is supplied to pre-coder circuit 134 which encodes the data with an FEC code. The encoded data is supplied to driver circuit 132 which is used to drive MZ modulator 130. The CW light supplied from DFB 108 is also rotated by polarization rotator 124 and is supplied to MZ modulator 130 via second output 113*b* of branching unit 113. MZ modulator 130 then modulates the encoded data received from driver 132. The modulated data signal from MZ modulator 130 is supplied to phase shifter 128 which shifts the phase of the signal 90°(π/2) and supplies it to second input 117*b* of branching unit 117. Alternatively, polarization rotator 136 may be dispose between branching unit 117 and PBC 138 and replaces rotator 124 in which case, the polarization rotator 136 rotates both the modulated signals from MZ modulators 126 and 130 rather than the CW signal from DFB 108 before modulation. The modulated data signal having wavelength λ1 from branching unit 115 is supplied to first port 138*a* of polarization beam combiner (PBC) 138. The modulated data signal from branching unit 117 having wavelength λ1' is supplied to second port 138*b* of polarization beam combiner (PBC) 138. PBC 138 combines all four (4) of the modulated data signals from branching units 115 and 117 and outputs a multiplexed optical signal to output port 138*a*. In this manner, a single DFB laser 108 provides a CW signal having a wavelength λ1 to four (4) separate MZ modulators 106, 112, 126 and 130 for modulating at least four (4) separate data channels by utilizing phase shifting and polarization rotation of the transmission signals. Previously, multiple CW light sources were used for each channel which increased device complexity, chip real estate, power requirements and associated manufacturing costs.

Alternatively, DFB 108 may also be configured as a dual output laser source to provide CW light to each of the MZ modulators 106, 112, 126 and 130 via branching units 111 and 13. In particular, coupler 10 may be replaced by DFB 108 configured as a back facet output device. Both outputs of DFB laser 108 would be used as the signal source. A first output 108a of DFB 108 supplies CW light to branching unit 111 connected to MZ modulators 106 and 112. The back facet or second output 108b of DFB 108 supplies CW light to branching unit 113 connected to MZ modulators 126 and 130. The dual output configuration provides sufficient power to the respective MZ modulators at a power loss far less than that experienced through 3 dB coupler 110. The CW light supplied from second output 108b is supplied to waveguide 143 which is either coupled directly to branching unit 113 or to polarization rotator 124 disposed between DFB 108 and branching unit 113. Polarization rotator 124 rotates the polarization of CW light supplied from second output 108b of DFB 108 and supplies the rotated light to MZ modulator 126 via first output 113a of branching unit 113 and to MZ modulator 130 via second output 113b of branching unit 113. Alternatively, polarization rotator 124 may be replaced by polarization rotator 136 disposed between branching unit 117 and PBC 138 in which case, polarization rotator 136 rotates both the modulated signals from MZ modulators 126 and 130 rather than the CW signal from back facet output 108b of DFB 108 before modulation.

Figure 1A:
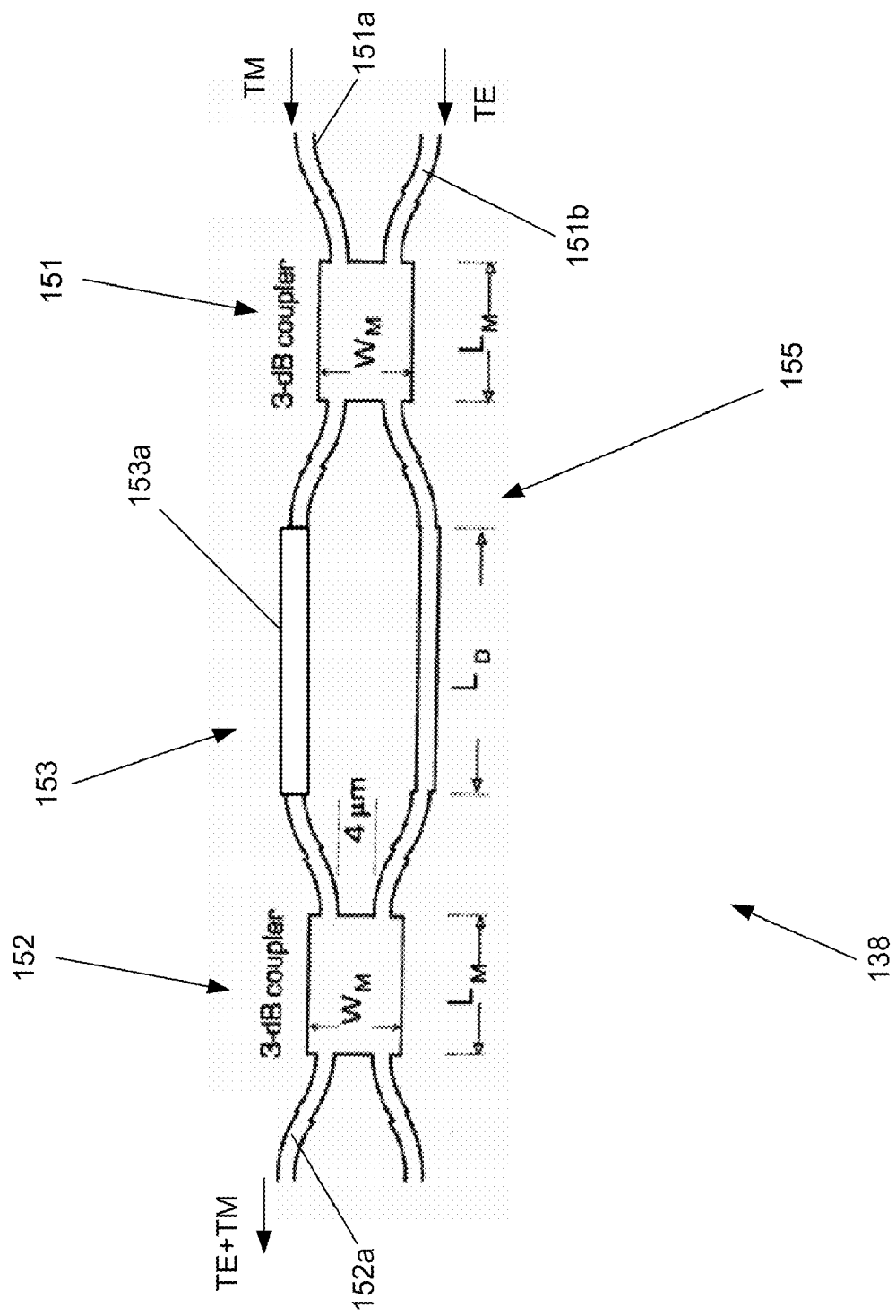
FIG. 1A illustrates an exemplary polarization beam combiner (138) shown in FIG. 1.

FIG. 1A is a block diagram of PBC 138 shown in FIG. 1 which is similar in construction to known polarization beam combiners. Generally, fiber optic polarization beam combiner 138 is a Mach-Zehnder interferometer polarization splitter having three-ports (138a, 138b and 138c) that is designed to couple light propagating from first input port 138a with a combination of polarization states to polarized light with a first polarization direction propagating from second input port 138b, and polarized light with a second orthogonal polarization direction all to output port 138c. In particular, PBC 138 includes a first 3-dB coupler 151, a second 3-dB coupler 152, and first and second differential waveguide arms 153 and 155 coupled therebetween. First 3 db coupler 151 has a length $L_M$ and width $W_M$. Second 3-dB coupler 152 has length $L_M$ and width $W_M$. The pair of differential arms 153 and 155 each have length $L_D$. The spacing of the waveguides of the first and second 3-dB couplers 151 and 152 may be, for example 4 μm. Light pulses have two primary and orthogonal polarization states referred to as the Transverse Electric (TE) and Transverse Magnetic (TM) modes. The TM component may be thought of as propagating perpendicular to an axis of the optical waveguide and the TE polarization mode may be thought of as propagating parallel to the axis of the optical waveguide. The TE effective index in both waveguides 153 and 155 remains nominally the same. However, first waveguide 153 may have a portion 153-a which comprises a metal-$SiO_2$ cladding on top of the waveguide. This composition provides waveguide 153 with a greatly reduced effective index in the TM polarization mode as compared to second waveguide 155. PBC 138 may have, for example, an insertion loss of approximately 1.5 dB and an extinction ratio of >15 dB. The TM polarization state of the optical signal enters input 151a of first 3-dB coupler 151 and propagates along waveguide 153. The TE polarization state of the optical signal enters input 151b of first 3-dB coupler 151 and propagates along waveguide 155. The polarization modes are combined via 3-dB coupler 152 and exit output port 152a. As a result, PBC 160 combines the TE and TM modes from input ports 151a and 151b to output port 152a of second 3-dB coupler 152.

Figure 2:
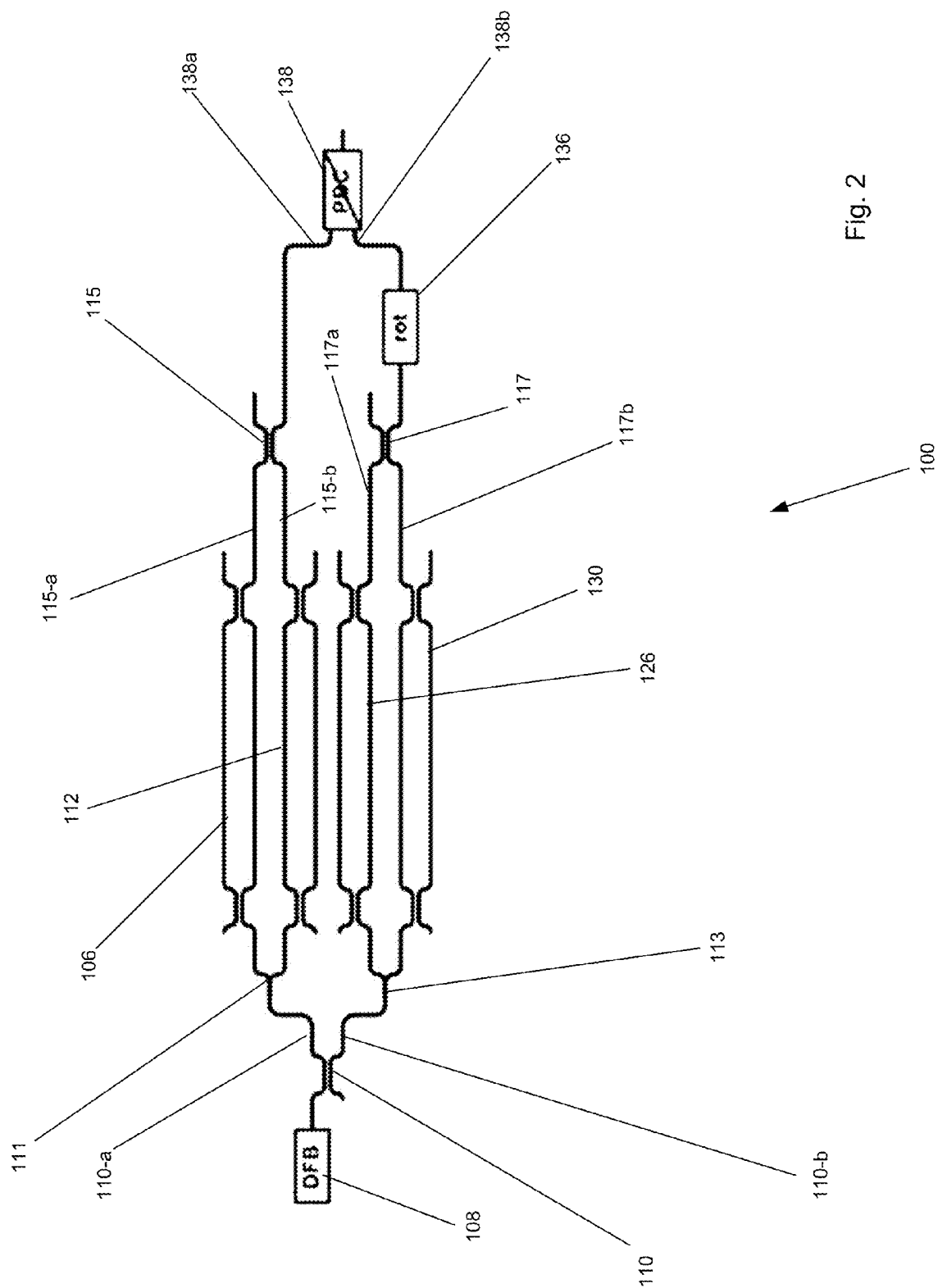
FIG. 2 is a schematic illustration of an exemplary single wavelength polarization multiplexed transmitter portion 100 shown in FIG. 1 in accordance with an embodiment of the present invention.

FIG. 2 is a schematic illustration of TxPIC layout of transmitter portion 100 shown in FIG. 1. As described above, DFB 108 is used as the common CW light source associated with at least four (4) modulated signals of transmitter portion 100. DFB 108 is connected to 3-dB coupler 110 which provides the CW light source to branching units 111 and 113 via output ports 110a and 110b respectively. Branching unit 111 supplies CW light to MZ modulator 106 via output port 111a and to MZ modulator 112 via output port 111b. Branching unit 113 supplies CW light to MZ modulator 126 via output port 113a and to MZ modulator 130 via output port 113b. For ease of explanation for this PIC layout description shown in FIG. 2, π/2 phase shifters 114, 128; rotator 124; driver circuits 104, 116, 122, and 132; and pre-coder circuits 102, 118, 120, and 134 have been omitted The MZ modulators 106, 112, 126 and 130 are driven by respective drive circuits to modulate the CW light signal from DFB 108 with encoded data received via pre-coder circuits 102, 118, 120, and 134 respectively.

The modulated signal from MZ modulator 106 is supplied to branching unit 115 via first input port 115a. The modulated signal from MZ modulator 112 is supplied to branching unit 115 via second input port 115b. Similarly, the modulated signal from MZ modulator 126 is supplied to branching unit 117 via first input port 117a and the modulated signal from MZ modulator 130 is supplied to branching unit 117 via second input port 117b. The alignment of the inputs of the branching unit 115 and 117 waveguides with each of the MZ modulator outputs must be such to minimize insertion loss and provide acceptable signal transmission. The output of branching unit 115 is coupled to input 138a of PBC 138. The output of branching unit 117 is coupled to polarization rotator 136 which provides the combined modulated signal from MZ modulators 126 and 130 to a second input 138b of PBC 138. Thus, PBC 138 combines all four (4) of the modulated data signals from branching units 115 and 117 and outputs a Pol Mux DQPSK optical signal.

Figure 3:
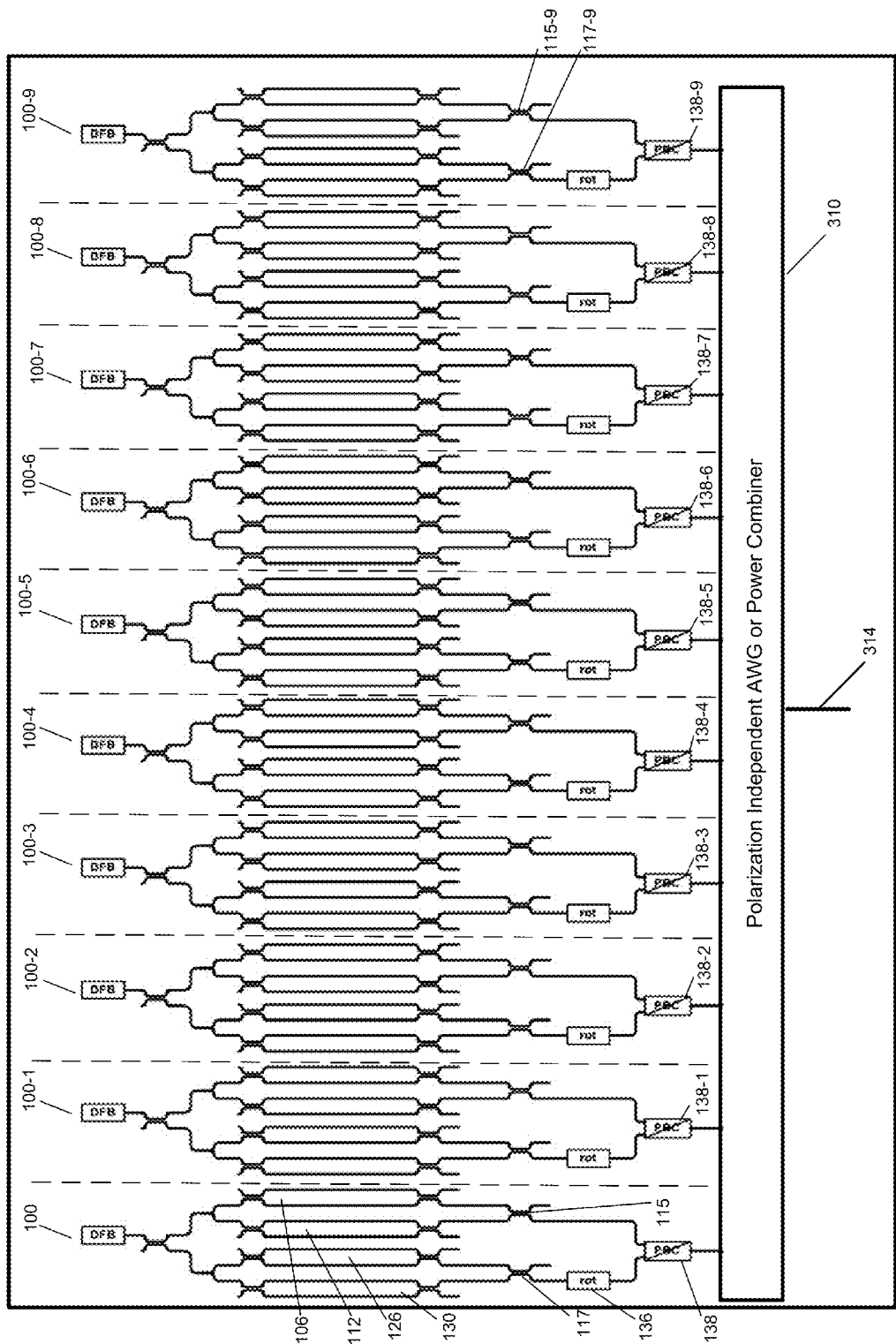
FIG. 3 is a schematic illustration of a plurality of exemplary transmitter portions 100-1 to 100-9 in accordance with an embodiment of the present invention employing a single polarization independent multiplexer for output of all channels to a single fiber.

FIG. 3 is a schematic illustration of a plurality of Pol Mux DQPSK transmitter portions 100-1 to 100-9 on a TxPIC substrate 312 which may include indium phosphide (InP) or other suitable III-V semiconductor material in accordance with the present invention. Each transmitter 100-1 to 100-9 includes a DEE laser and corresponding 3 dB couplers, branching units, MZ modulators and corresponding polarization beam combiners (PBC) as described with reference to FIG. 1. The wavelength of each DFB 108-108₉ is stabilized to a particular wavelength corresponding to a wavelength on the ITU (International Telecommunications Union) grid and each DFB provides CW light to four associated MZ modulators (106, 112, 126 and 130). Each of the transmitters includes PBCs 138 to 138-9 which provide the respective optical signals directly to polarization independent arrayed waveguide grating (AWG) or power combiner 310. AWG 310 multiplexes the outputs from each transmitter portion 100 to 100-9 onto waveguide 314 which, in-turn, may feed the multiplexed output to other optical components such as, for example, an optical filter or photonic lightwave circuit (PLC) integrated on silicon or silicon on insulator SOI based circuit.

Figure 4:
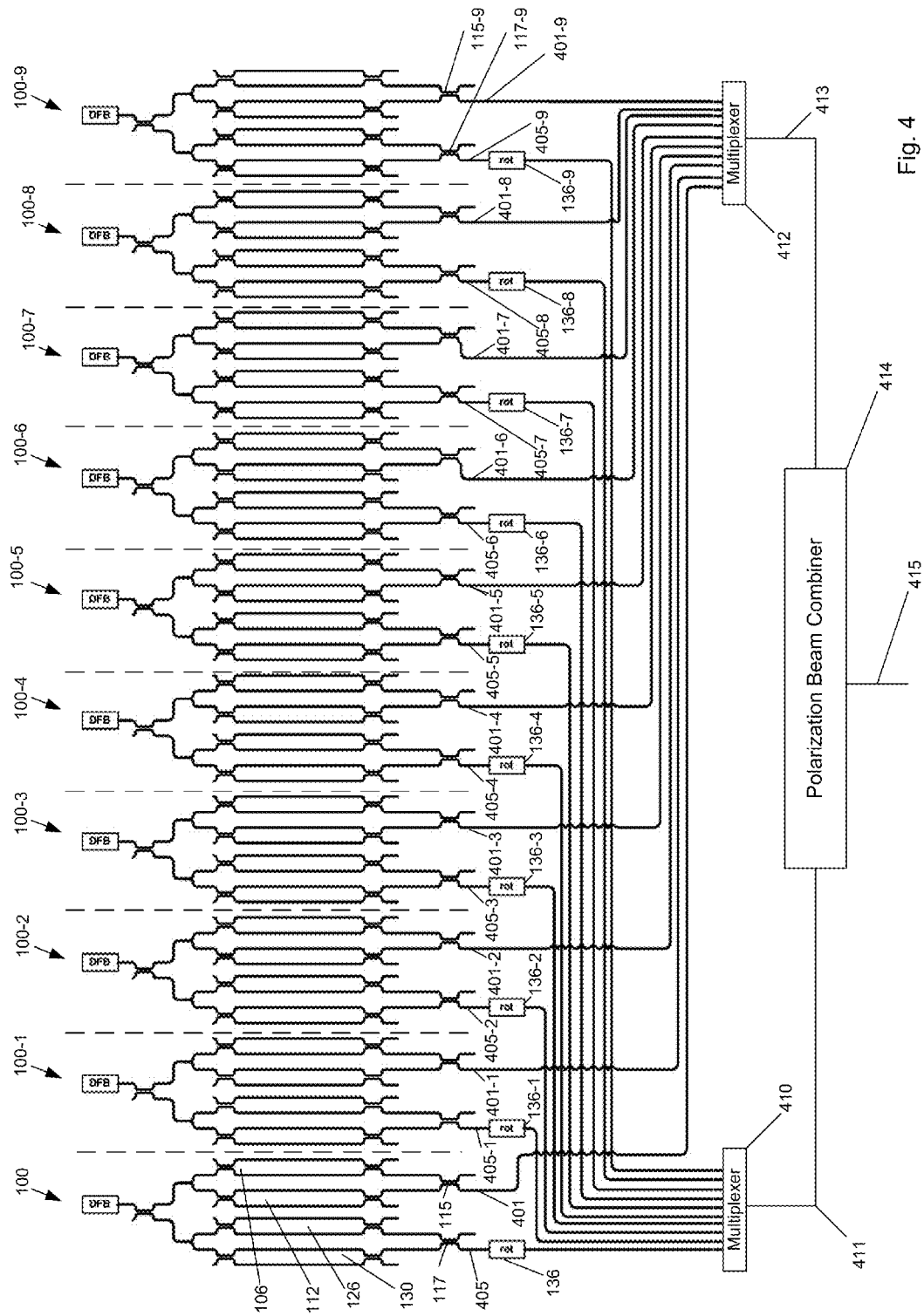
FIG. 4 is a schematic illustration of an alternative embodiment of the present invention employing dual multiplexers in combination with a polarization beam combiner.

FIG. 4 is a schematic illustration of an alternative embodiment of the present invention employing dual multiplexers 410 and 412 in combination with a single polarization beam combiner 414. In particular, each transmitter portion 100 to 100-9 includes polarization rotators 136 to 136-9 which receives corresponding inputs 405 to 405-9 from branching units 117 to 117-9. Each of the outputs from polarization rotators 136 to 136-9 are supplied to and combined by first multiplexer 410 and supplied to first waveguide 411. Similarly, each branching unit 115 to 115-9 supplies a corresponding non-polarization rotated output signal 401 to 401-9 to second multiplexer 412 which combines the signals and supplies an output to second waveguide 413. Thus, the outputs from polarization rotators 136 to 136-9 are supplied to first multiplexer 410 and the outputs from branching units 115 to 115-9 are supplied to second multiplexer 412. Waveguide 411 is coupled between first multiplexer 410 and PBC 414 and supplies the multiplexed polarization rotated outputs from multiplexer 410 to PBC 414. Similarly, waveguide 413 is coupled between second multiplexer 412 and PBC 414 and supplies the multiplexed non-polarization rotated signals from multiplexer 412 to PBC 414. PBC 414 combines the multiplexed outputs received via waveguides 411 and 413 and supplies it to waveguide 415. Multiplexers 410 and 412 (each of which include an AWG) and transmitter portions 100 to 100-9 may be manufactured on an InP substrate associated with a TxPIC, while waveguides 411 and 413, as well as polarization beam combiner 414, may be provided on a PLC integrated, for example, on silicon. In this manner, the polarization independent AWG 310 illustrated with reference to FIG. 3 is not required in the PIC layout of FIG. 4. Rather, a first and second multiplexers 410, 412 together with PBC 414 are utilized to supply a combined a DQPSK multiplexed output signal to waveguide 415.

Figure 5:
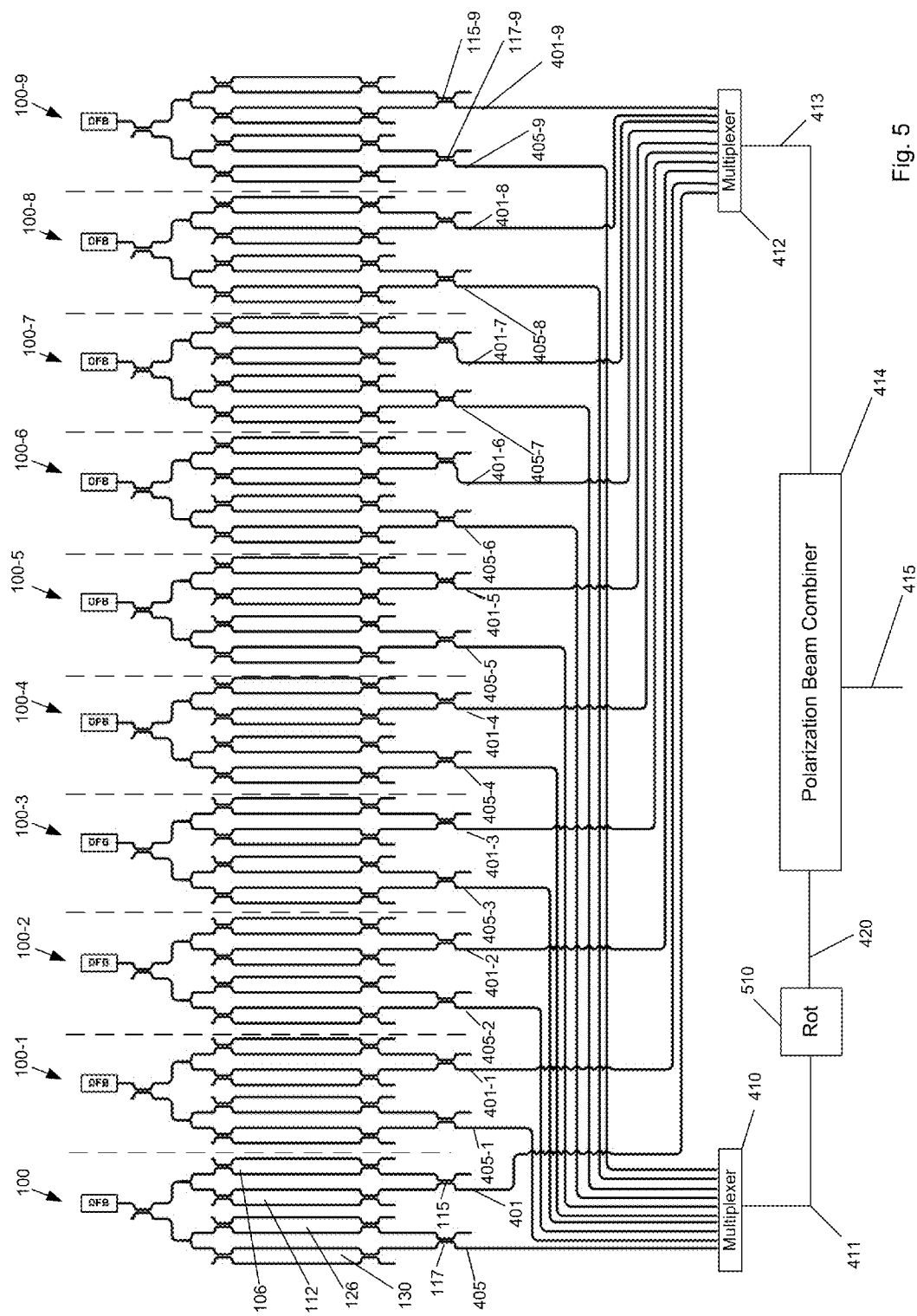
FIG. 5 is a schematic illustration of an alternative embodiment of the present invention employing a single polarization rotator.

FIG. 5 is a schematic illustration of an alternative embodiment of the present invention employing a single rotator 510 disposed between multiplexer 410 and PBC 414 which replaces the plurality of polarization rotators 136 to 136-9. In particular, each transmitter portion 100 to 100-9 comprises the same components as that described with reference to FIG. 4 with the exception of the polarization rotators 136 to 136-9. Each transmitter portion 100 to 100-9 supplies a first multiplexed output signal 405 to 405-9 via branching units 117 to 117-9 and a second output multiplexed signal 401 to 401-9 via branching units 115 to 115-9, respectively. First output signals 405 to 405-9 are combined by first multiplexer 410 and supplied to first waveguide 411 which is coupled between first multiplexer 410 and polarization rotator 510. The multiplexed first output signals 405 to 405-9 are polarization rotated by rotator 510 and supplied to PBC 414 via waveguide 420. Second output signals 401 to 401-9 are combined by second multiplexer 412. Second waveguide 413 is coupled to second multiplexer 412 and supplies the second output signals 401 to 401-9 directly to PBC 414 without being polarization rotated. Each of multiplexers 410 and 412 maybe, for example AWGs. PBC 414 combines the multiplexed outputs received via waveguides 420 and 413 and supplies the output to waveguide 415. In this manner, the polarization rotators 136 to 136-9 are replaced with a single polarization rotator coupled between multiplexer 410 and PBC 414. In addition, transmitter portions 100 to 100-9, first multiplexer 410 and second multiplexer 412 may be manufactured on an InP substrate associated with a PIC. In addition, polarization rotator 510 and PBC 414 may also be manufactured on an InP substrate along with transmitter portions 100 to 100-9, first multiplexer 410 and second multiplexer 412. Alternatively, polarization rotator 510 and PBC 414 may be manufactured on a Si substrate associated with a PLC or silicon on insulator SOI based circuit.

Figure 6:
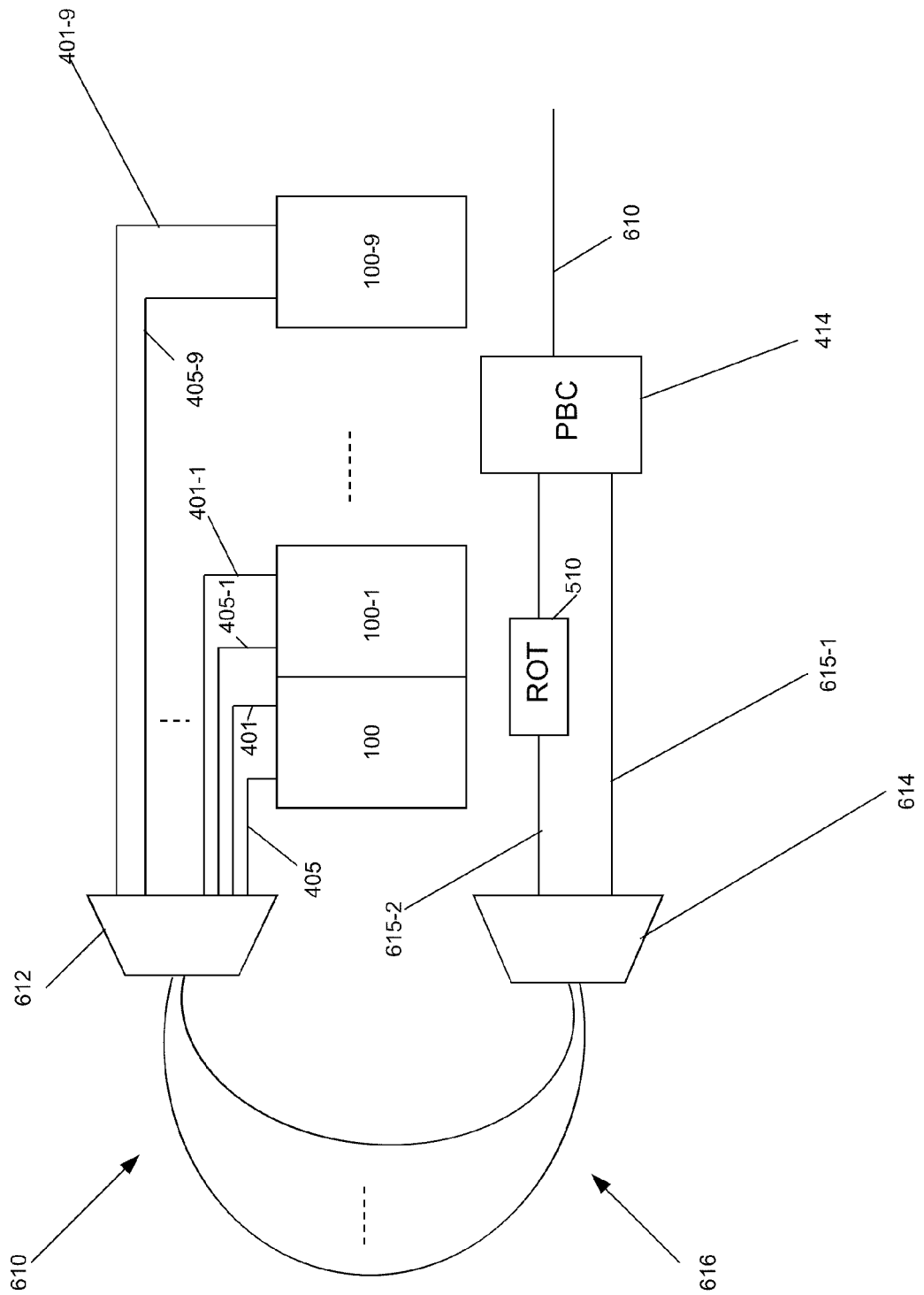
FIG. 6 is a schematic illustration of an alternative embodiment of the present invention employing a single AWG and a single polarization rotator.

FIG. 6 is a schematic illustration of an alternative embodiment of the present invention employing a single AWG 610 which replaces multiplexers 410 and 412 as well as inputs thereto which simplifies the design of the PIC. In particular, each of the transmitter portions 100 to 100-9 comprises the same components as that described with reference to FIG. 4 with the exception of the polarization rotators 136 to 136-9. Each transmitter portion 100 to 100-9 supplies signals split into two equal power arms, namely first multiplexed output signal 405 to 405-9 and second output multiplexed signal 401 to 401-9. Each of the multiplexed output signals 405 to 405-9 and 401 to 401-9 undergo DQPSK modulation with associated encoded data signals via transmitter portions 100 to 100-9. AWG 610 includes dielectric slabs or free space regions 612 and 614 and a plurality of waveguides 616 coupled therebetween. AWG 610 may have, for example, an associated transmission spectrum having a plurality of transmission maxima. This spectral spacing is ½ the spacing of multiplexers (or AWGs) 410 and 412 shown in FIG. 5. For example, if the channel spacing of each of the DFB lasers 108 to 108-9 of transmitter portions 100 to 100-9 is xGHz (e.g. 100 GHz) then the channel spacing of AWG 610 is x/2 GHz (e.g. 50 GHz). Thus, even though each of the optical signals 405 and 401 generated from transmitter portion 100 have the same wavelength (i.e. generated by a shared DFB 108), these signals 405 and 401 enter AWG 610 on different input arms having a spectral spacing x/2 GHz apart on free space region 612. Similarly, each of the optical signals 405-n and 401-n generated from a transmitter portion 100-n has the same wavelength generated by the shared DFB 108-n and enters AWG 610 on different input arms having a spectral spacing x/2 GHz apart on free space region 612. As a result, the output signal 405 emerges from free space region 614 on waveguide 615-2 and output signal 401 emerges from free space region 614 on waveguide 615-1. Likewise, all inputs to free space region 612 follow the pattern that the input signal (either 401-y or 405-y, where y=1 to 9) closest to the transmitter portion 100-y emerges from free space region 614 on waveguide 615-2; and the companion input (either 401-y or 405-y) emerges from free space region 614 on output waveguide 615-1. The signals that travel through AWG 610 may be in the TE polarization mode. Once the signals emerges from free space region 614, output waveguide 615-2 is rotated by polarization rotator 510 and combined with the non-rotated signal on waveguide 615-1 via PBC 414. The output of PBC 414 is supplied to output waveguide 610.

Figure 6B:
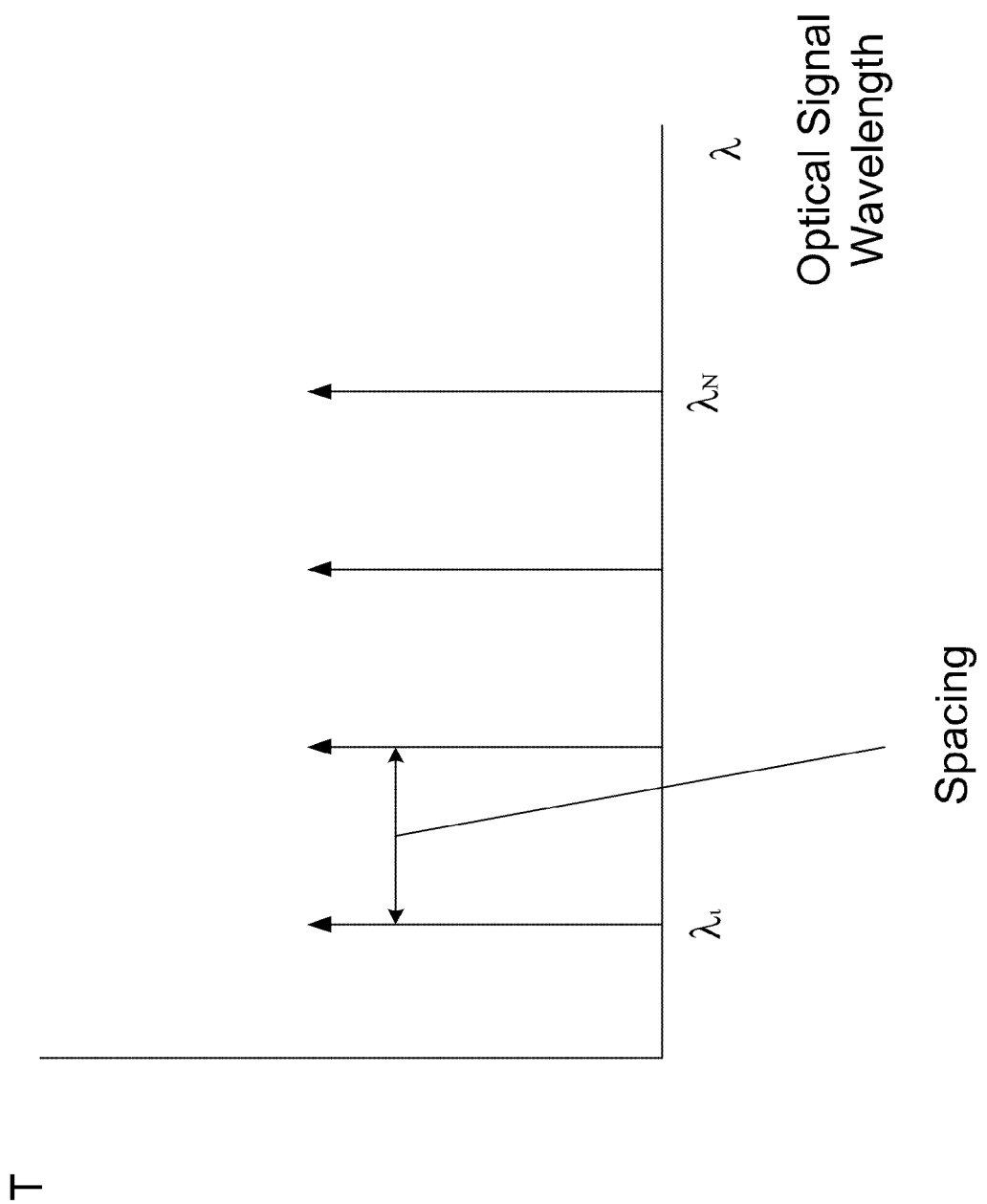
FIG. 6B illustrates a transmission spectrum for the plurality of wavelengths associated with the transmitter portions in accordance with an embodiment of the present invention.
Figure 6C:
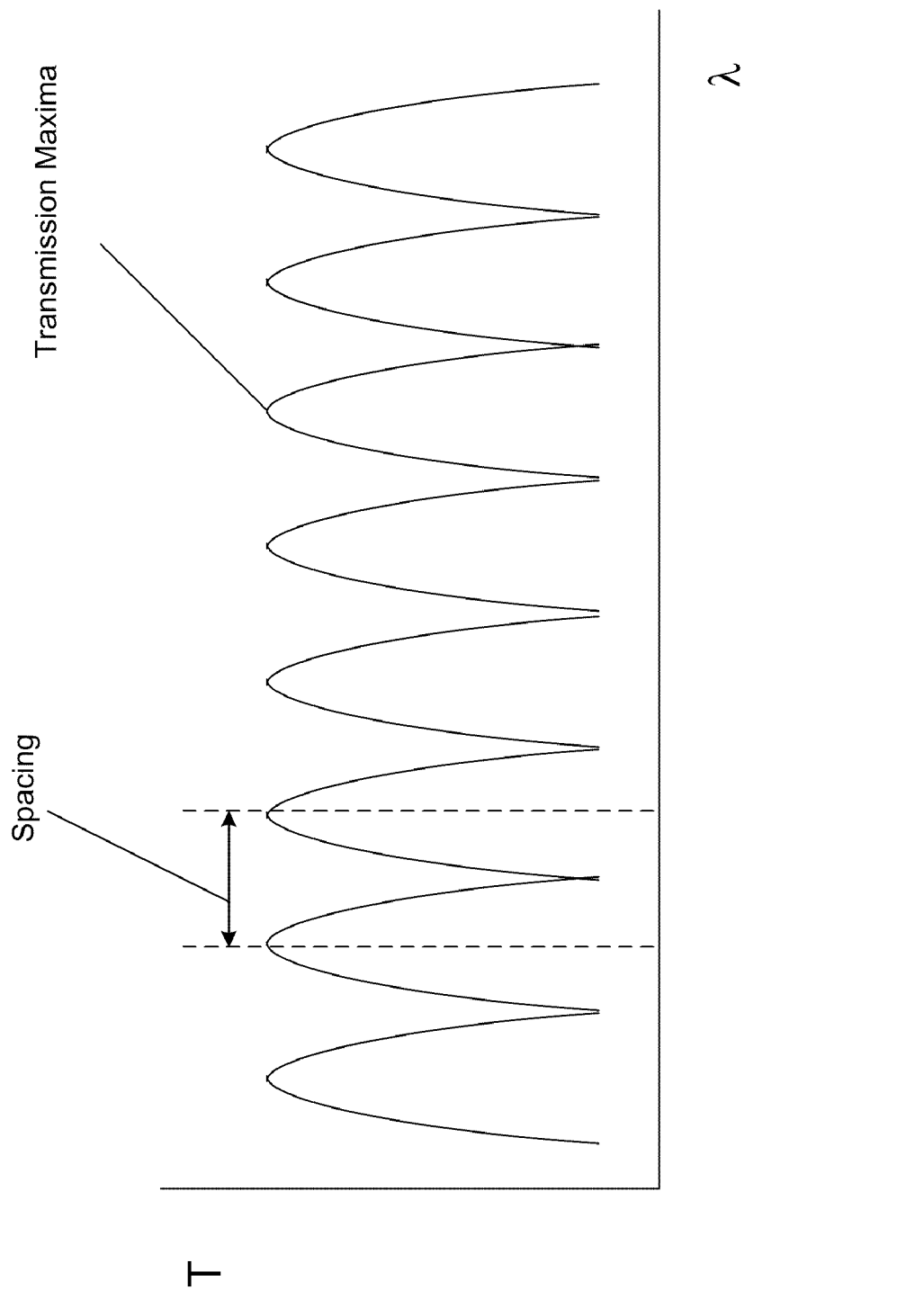
FIG. 6C illustrates a transmission spectrum associated with the AWG shown in FIG. 6A in accordance with an embodiment of the present invention.

FIG. 6A is a block diagram of an exemplary AWG shown in FIG. 6 illustrating the combination of inputs from two of the transmitters 100 to 100-9 and the associated multiplexed signals to further illustrate the function of AWG 610. For example, transmitter 100 supplies first optical signals having wavelength $\lambda 1$ (which may correspond to signal 405) to free space region 612 and second optical signals having wavelength $\lambda 1'$ (which may correspond to signal 401) to free space region 612. The second transmitter, for example 100-1 supplies first optical signals having wavelength $\lambda 2$ (which may correspond to signal 405-1) to free space region 612 and second optical signals having wavelength $\lambda 2'$ (which may correspond to signal 401-1) to free space region 612. FIGS. 4 and 5 illustrate a first multiplexer 410 used to combine signals 405 to 405-9 corresponding to $\lambda 1, \lambda 2 \ldots \lambda N$ and a second multiplexer 412 to combine signals 401 to 401-9 corresponding to wavelengths $\lambda 1', \lambda 2' \ldots \lambda N'$. AWG 610 utilizes ½ the spectral spacing to obviate the need for multiplexers 410 and 412. In particular, the spacing between the input ports to AWG 610 which receives signals having wavelengths $\lambda 1$ and $\lambda 1'$ is ½ the spacing between the input ports that receive the signals having wavelength $\lambda 1$ and $\lambda 2$. Similarly, the input ports to AWG 610 that receive signals having wavelengths $\lambda 2$ and $\lambda 2'$ is ½ the spacing between the input ports that receive the signals having wavelengths $\lambda 1$ and $\lambda 2$. Thus, in this example the signals having wavelengths $\lambda 1$ and $\lambda 2$ are output on a first output (corresponding to output 615-1 shown in FIG. 6) of second free space region 614 and the signals having wavelengths $\lambda 1'$ and $\lambda 2'$ are output via a second output (corresponding to output 615-2 shown in FIG. 6) of second free space region 614. FIG. 6B illustrates a transmission spectrum for each of the plurality of wavelengths λ1 . . . λN associated with transmitters 100 to 100-9 having a particular spectral spacing. FIG. 6C illustrates a transmission spectrum associated with AWG 610 which has a plurality of transmission maxima. Each of the transmission maxima of AWG 610 are separated from one another by a spectral spacing that is ½ of the spectral spacing associated with wavelengths λ1 . . . λN shown in FIG. 6B. In this manner, the first optical signals from each of the transmitters 100 to 100-9 are output by AWG on a first output port as a first wavelength division multiplexed optical signal and the second optical signal from each of the transmitters 100 to 100-9 are output by AWG 610 on a second output port as a second wavelength division multiplexed optical signal.

Figure 7:
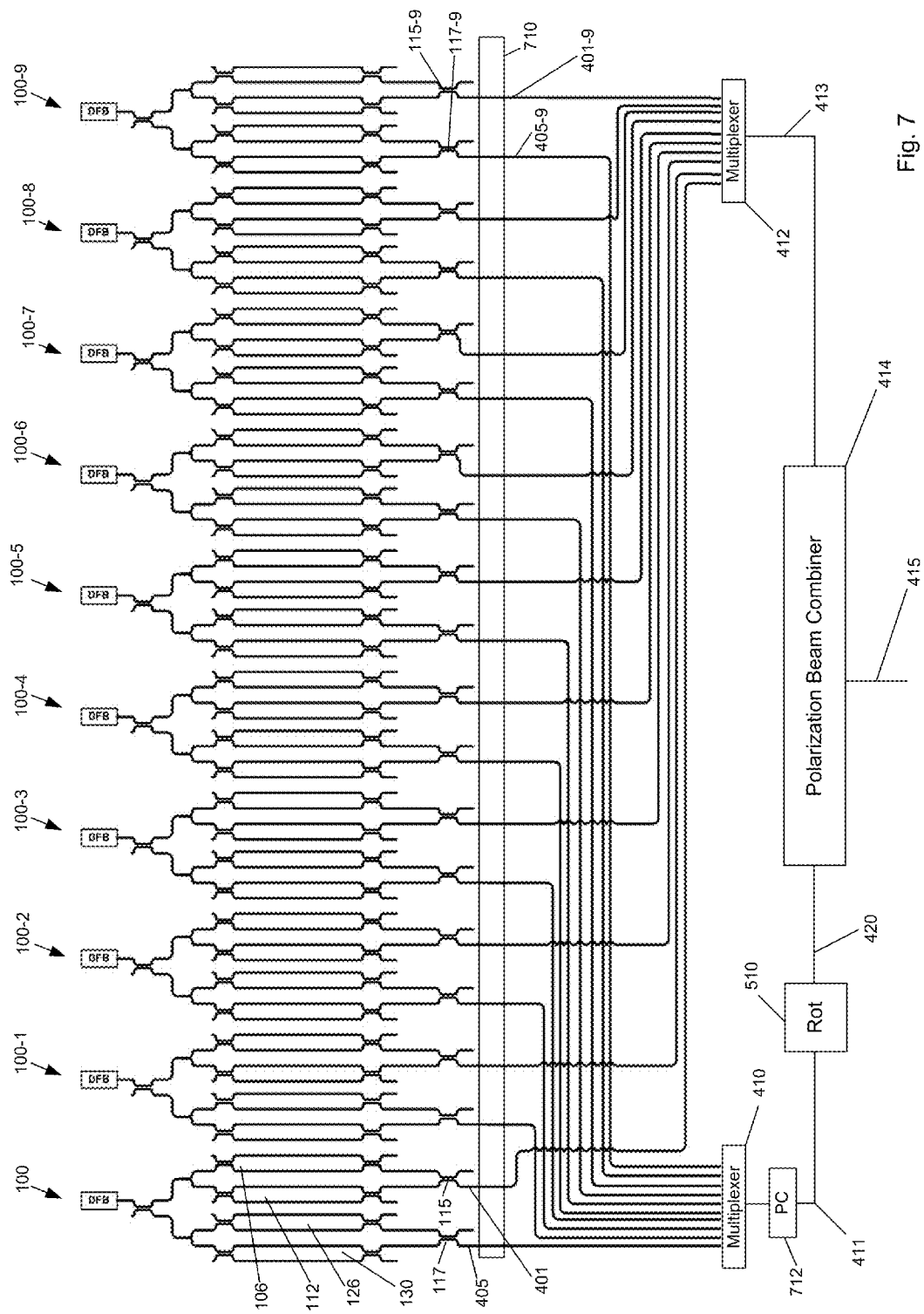
FIG. 7 is a schematic illustration of an alternative embodiment of the present invention employing pulse carvers disposed before or after optical multiplexers.

FIG. 7 is a schematic illustration of an alternative embodiment of the present invention employing pulse carvers disposed before or after multiplexers 410 and 412. These pulse carvers may be used to generate RZ Pol Mux DQPSK optical signals which are characterized by relatively narrow spectral width and higher chromatic dispersion and PMD tolerances to long distance propagation through optical fiber. In particular, each of the transmitter portions 100 to 100-9 comprises the same components as that described with reference to FIG. 4 with the exception of the addition of pulse carver 710 or a pair of pulse carvers 712 and 714. Each transmitter portion 100 to 100-9 supplies first output signals 405 to 405-9 and second output signals 401 to 401-9. First output signals 405 to 405-9 are supplied to pulse carver 710 disposed between branching units 115 to 115-9 and multiplexer 410. Similarly, second output signals 401 to 401-9 are supplied to pulse carver 710 disposed between branching units 117 to 117-9 and multiplexer 412. Pulse carver 710 is configured to amplitude modulate the output signals 401 to 401-9 and 405 to 405-9 received from each transmitter portion 100 to 100-9. Pulse carver 710 includes an amplitude modulator such as, for example, a Mach-Zender interferometer or an electro-absorption modulator (EAM). Mach-Zender interferometers have been described previously. EAMs modulate light by absorption through the Quantum Confined Stark effect. In particular, when an electric field is applied across the quantum well structure of an LAM, the effective band gap energy of the quantum well structure changes and the EAM absorbs light when a reverse bias is applied to the junction. The more light absorbed, the higher the extinction ratio (i.e. the ratio of the maximum power output to the minimum power output).

First output signals 405 to 405-9 are combined by first multiplexer 410 and supplied to first polarization rotator 510 via waveguide 411. Output signals 405 to 405-9 are polarization rotated by rotator 510 and supplied to PBC 414 via waveguide 420. Output signals 401 to 401-9 are combined by second multiplexer 412 and supplied to PBC 414 via waveguide 413 without being polarization rotated. PBC 414 combines the multiplexed outputs received via waveguides 420 and 413 and supplies the output to waveguide 415. Alternatively, pulse carver 710 may be replaced by a pair of pulse carvers 712 and 714 which simultaneously amplitude modulates the combined optical signals received from multiplexers 410 and 412. In particular, pulse carver 712 is disposed between multiplexer 410 and polarization rotator 510. Pulse carver 714 is disposed between multiplexer 412 and PBC 414. Output signals 405 to 405-9 combined by multiplexer 410 are supplied to pulse carver 712 which amplitude modulates the combined signals each having a different wavelength. Similarly, output signals 401 to 401-9 combined by multiplexer 412 are supplied to pulse carver 714 which amplitude modulates the combined signals each having a different wavelength. Additional circuitry may be required to time the outputs of multiplexers 410 and 412 appropriately to the respective pulse carvers 712 and 714 to compensate for variations in propagation speeds associated with the different wavelengths of the combined multiplexed signals 405 to 405-9 and 401 to 401-9. This additional circuitry also compensates for delays associated with different lengths of the waveguides that supply the combined output signals to each of the pulse carvers 712 and 714.

Figure 8:
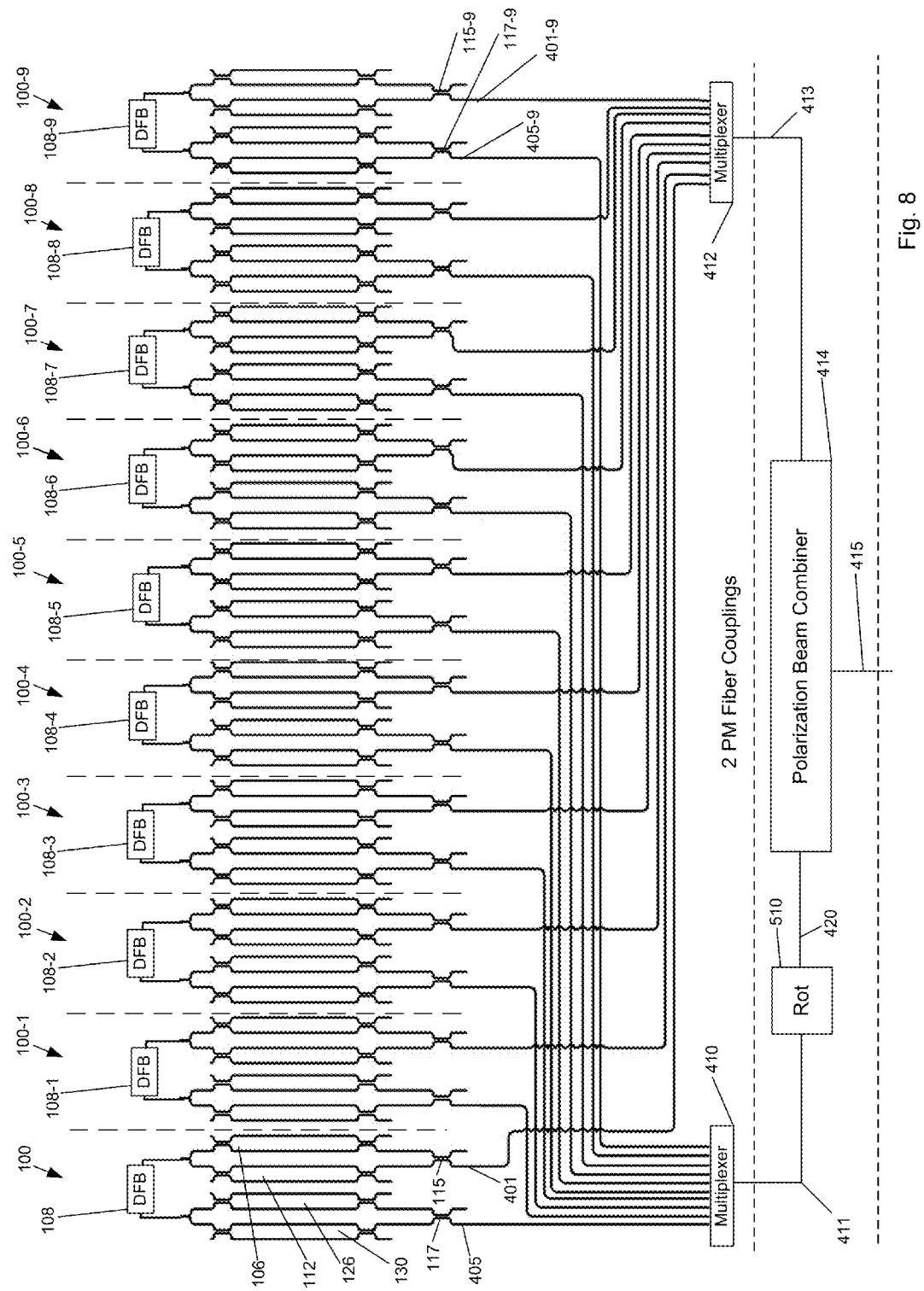
FIG. 8 is a schematic illustration of an alternative embodiment of the present invention employing dual output DFBs as the CW light source.

FIG. 8 is a schematic illustration of an alternative embodiment of the present invention similar to the layout shown with reference to FIG. 5 with the exception of employing dual output DFBs as the CW light source. In particular, the dual output DFB configuration was described earlier with reference to FIG. 1 where 3 dB coupler 110 is replaced by a DFB 108 having first output 108a and second output 108b. Each of the transmitter portions 100 to 100-9 includes dual output DFBs 108 to 108-9. The CW light supplied from first output 108a of each of the DFB laser sources 108 to 108-9 is supplied to MZ modulators 106 and 112 via branching units 111. The CW light supplied from second output 108b of each of the DFB laser sources 108 to 108-9 is supplied to MZ modulators 126 and 130 via branching units 113. MZ modulators 106 and 112 supply the modulated optical signals to branching unit 115. MZ modulators 126 and 130 supply the modulated optical signals to branching unit 117. Branching units 115 associated with each of the transmitters 100 to 100-9 supply a first output signal 405 to 405-9. Branching units 117 associated with each of the transmitters 100 to 100-9 supply a second output signal 401 to 401-9. First output signals 405 to 405-9 are combined by first multiplexer 410 and supplied to first waveguide 411 which is coupled between first multiplexer 410 and polarization rotator 510. The multiplexed first output signals 405 to 405-9 are polarization rotated by rotator 510 and supplied to PBC 414 via waveguide 420. Second output signals 401 to 401-9 are combined by second multiplexer 412. Second waveguide 413 is coupled to second multiplexer 412 and supplies the second output signals 401 to 401-9 directly to PBC 414 without being polarization rotated. Each of multiplexers 410 and 412 may be, for example, AWGs. PBC 414 combines the multiplexed outputs received via waveguides 420 and 413 and supplies the output to waveguide 415. In this manner, dual output DFBs 108 to 108-9 are utilized in each transmitter portion 100 to 100-9 which replaces the 3 dB coupler and provides less loss to the CW signals to be modulated by MZ modulators 106, 112, 126 and 130.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:
1. An apparatus, comprising;
a substrate;
a plurality of transmitters provided on the substrate, the plurality of transmitters supplying a plurality of first multiplexed optical signals, each of the plurality of first multiplexed optical signals having a corresponding one of a plurality of wavelengths, each of the plurality of transmitters comprising:

a laser configured to output a continuous wave (CW) optical signal, the CW optical signal having a corresponding one of a plurality of wavelengths;

a plurality of modulators, each of which receiving a corresponding one of a plurality of portions of the CW optical signal, each of the plurality of modulators supplying a corresponding one of a plurality of modulated optical signals;

a plurality of phase shifters configured to receive selected ones of the plurality of modulated signals and output a plurality of phase shifted modulated optical signals; and a first optical combiner configured to combine remaining ones of the plurality of modulated optical signals and the plurality of phase shifted modulated optical signals, the first optical combiner outputting one of the plurality of first multiplexed optical signals; and a second optical combiner, the second optical combiner configured to receive the plurality of first multiplexed optical signals and configured to output a second multiplexed optical signal.

2. The apparatus of claim 1 wherein each of the plurality of transmitters further comprising a polarization rotator configured to receive at least one of said plurality of phase shifted modulated optical signals and at least one of said remaining ones of the plurality of modulated optical signals and outputting polarization rotated optical signals to said first optical combiner.

3. The apparatus of claim 1 wherein each of the plurality of transmitters further comprises a polarization rotator configured to receive corresponding portions of the CW optical signal associated with said selected ones of the plurality of modulators and outputting polarization rotated portions of the CW optical signal.

4. The apparatus of claim 1 wherein said first optical combiner is a polarization beam combiner configured to output a polarization multiplexed differential quadrature phase-shift keying signal.

5. The apparatus of claim 4 wherein said polarization beam combiner comprises a first and second optical couplers and a first and second differential waveguides disposed between said first and second couplers.

6. The apparatus of claim 5 wherein a portion of said first differential waveguide comprises a metal $SiO_2$ cladding layer.

7. The apparatus of claim 1 wherein said second optical combiner is a polarization independent arrayed waveguide grating.

8. The apparatus of claim 1 wherein each of the plurality of transmitters further comprising a plurality of driver circuits coupled to each of said corresponding plurality of modulators, each of said driver circuits driving a corresponding one of said plurality of modulators.

9. The apparatus of claim 8 wherein each of the plurality of transmitters further comprising a plurality of pre-coder circuits coupled to said corresponding plurality or driver circuits, each of said pre-coder circuits configured to encode data with a forward error correction code and supplying said encoded signal to said corresponding driver circuit.

10. The apparatus of claim 1 wherein each of the plurality of transmitters further comprising: an optical coupler coupled to said laser; and a branching unit having an input coupled to said optical coupler, said branching unit having a first output configured to supply a corresponding one of the plurality of portions of the CW optical signal to a first of said plurality of modulators, said branching unit having a second output configured to supply a corresponding one of the plurality of portions of the CW optical signal to a second of said plurality of modulators.

11. The apparatus of claim 10 wherein said branching unit is a first branching unit, each of the plurality of transmitters further comprising a second branching unit having a first output configured to supply a corresponding one of the plurality of portions of the CW optical signal to a third of said plurality of modulators, said second branching unit having a second output configured to supply a corresponding one of the plurality of portions of the CW optical signal to a fourth of said plurality of modulators.

12. The apparatus of claim 11 wherein each of the plurality of transmitters further comprising a third branching unit having a first input coupled to said first modulator and a second input coupled to said second modulator, said third branching unit supplying the corresponding one of the plurality of modulated optical signals from each of said first and second modulators to said first combiner.

13. The apparatus of claim 12 further comprising a fourth branching unit having a first input coupled to said third modulator and a second input coupled to said fourth modulator, said fourth branching unit configured to output the corresponding one of the plurality of modulated optical signals from each of said third and fourth modulators to said first combiner.

14. An apparatus, comprising:

a substrate;

a plurality of transmitters provided on the substrate, each of the plurality of transmitters comprising:

a laser configured to output a continuous wave (CW) optical signal, the CW optical signal having a corresponding one of a plurality of wavelengths;

a plurality of modulators, each of which receiving a corresponding one of a plurality of portions of the CW optical signal each of the plurality of modulators supplying a corresponding one of a plurality of modulated optical signals;

a plurality of phase shifters configured to receive selected ones of the plurality of modulated signals and output a plurality of phase shifted modulated optical signals, each of the plurality of modulated optical signals having a corresponding one of a plurality of wavelengths, and each of the plurality of phase shifted modulated optical signals having a corresponding one of the plurality of plurality of wavelengths;

a first optical multiplexer provided, the first optical multiplexer configured to multiplex a first one of said plurality of phase shifted modulated optical signals from each of said plurality of transmitters with a first one of said plurality of modulated optical signals from each of said plurality of transmitters and outputting a first multiplexed optical signal;

a second optical multiplexer, the second optical multiplexer configured to multiplex a second one of said plurality of phase shifted modulated optical signals from each of said plurality of transmitters with a second one of said plurality of modulated optical signals from each of said plurality of transmitters and outputting a second multiplexed optical signal;

and an optical combiner, the optical combiner configured to receive the first and second multiplexed optical signals and output a third multiplexed optical signal.

15. The apparatus of claim 14 wherein each of the plurality of transmitters further comprising a polarization rotator configured to receive at least one of said plurality of phase shifted modulated optical signals and at least one of said plurality of modulated optical signals and outputting a polarization rotated optical signal.

16. The apparatus of claim 14 wherein each of the plurality of transmitters further comprises a polarization rotator configured to receive corresponding portions of the CW optical signal associated with said selected ones of the plurality of modulators and outputting polarization rotated portions of the CW optical signal.

17. The apparatus of claim 14 wherein said first multiplexed optical signal having respective polarization modes, said photonic integrated circuit further comprising a polarization rotator provided on the substrate, said polarization rotator disposed between said first multiplexer and said combiner and configured to rotate the corresponding polarization modes associated with said first multiplexed optical signal.

18. The apparatus of claim 14 further comprising a pulse carver provided on said substrate, said pulse carver disposed between each of said transmitter portions and said first and second multiplexers, said pulse carver configured to amplitude modulate each of the phase shifted modulated optical signals and the remaining ones of the plurality of modulated optical signals from each of said plurality of transmitters and output said amplitude modulated signals to said first and second multiplexers.

19. The apparatus of claim 14 further comprising: a first pulse carver provided on said substrate, said first pulse carver disposed between said first multiplexer and said combiner, said first pulse carver configured to amplitude modulate the first multiplexed optical signal and output said amplitude modulated first multiplexed optical signal to said combiner; and a second pulse carver provided on said substrate, said second pulse carver disposed between said second multiplexer and said combiner, said second pulse carver configured to amplitude modulate the second multiplexed optical signal and output said amplitude modulated second multiplexed optical signal to said combiner.

20. The apparatus of claim 14 wherein said laser is a dual output distributed feedback laser having a first output and a back facet output and said CW optical signal is a first and second CW optical signal having said corresponding one of a plurality of wavelengths, said first output configured to supply said first CW optical signal to selected ones of said plurality of modulators, said back facet output configured to supply said second CW optical signal to remaining ones of said plurality of modulators.

21. The apparatus of claim 14 wherein each of the plurality of transmitters further comprising a plurality of driver circuits coupled to each of said corresponding plurality of modulators, each of said driver circuits driving a corresponding one of said plurality of modulators.

22. The apparatus of claim 21 wherein each of the plurality of transmitters further comprising a plurality of pre-coder circuits coupled to said corresponding plurality or driver circuits, each of said pre-coder circuits configured to encode data with a forward error correction code and supplying said encoded signal to said corresponding driver circuit.

23. The apparatus of claim 14 wherein each of the plurality of transmitters further comprising: an optical coupler coupled to said laser; and a branching unit having an input coupled to said optical coupler, said branching unit having a first output configured to supply a corresponding one of the plurality of portions of the CW optical signal to a first of said plurality of modulators, said branching unit having a second output configured to supply a corresponding one of the plurality of portions of the CW optical signal to a second of said plurality of modulators.

24. The apparatus of claim 23 wherein said branching unit is a first branching unit, each of the plurality of transmitters further comprising a second branching unit having a first output configured to supply a corresponding one of the plurality of portions of the CW optical signal to a third of said plurality of modulators, said second branching unit having a second output configured to supply a corresponding one of the plurality of portions of the CW optical signal to a fourth of said plurality of modulators.

25. The apparatus claim 24 wherein each of the plurality of transmitters further comprising a third branching unit having a first input coupled to said first modulator and a second input coupled to said second modulator, said third branching unit supplying the corresponding one of the plurality of modulated optical signals from each of said first and second modulators to said first multiplexer.

26. The apparatus of claim 25 further comprising a fourth branching unit having a first input coupled to said third modulator and a second input coupled to said fourth modulator, said fourth branching unit configured to output the corresponding one of the plurality of modulated optical signals from each of said third and fourth modulators to said second multiplexer.

* * * * *